(12) United States Patent
Dechau

(10) Patent No.: US 11,922,795 B2
(45) Date of Patent: Mar. 5, 2024

(54) SUPPORT COMPONENT OF A HOUSING OF A HAZARD ALERT CENTER AND A HAZARD ALERT CENTER, PREFERABLY AN INTRUDER ALERT, FIRE ALARM AND/OR EXTINGUISHING CONTROL CENTER

(71) Applicant: Minimax Viking Research & Development GmbH, Bad Oldesloe (DE)

(72) Inventor: Carl Dechau, Bad Oldesloe (DE)

(73) Assignee: Minimax Viking Research & Development GmbH, Bad Oldesloe (DE)

( * ) Notice: Subject to any disclaimer, the term of this patent is extended or adjusted under 35 U.S.C. 154(b) by 279 days.

(21) Appl. No.: 17/439,185

(22) PCT Filed: Mar. 18, 2020

(86) PCT No.: PCT/EP2020/057413
§ 371 (c)(1),
(2) Date: Sep. 14, 2021

(87) PCT Pub. No.: WO2020/187974
PCT Pub. Date: Sep. 24, 2020

(65) Prior Publication Data
US 2022/0157153 A1 May 19, 2022

(30) Foreign Application Priority Data
Mar. 18, 2019 (DE) .................. 10 2019 106 868.1

(51) Int. Cl.
*G08B 25/12* (2006.01)
*H05K 5/00* (2006.01)
*H05K 5/02* (2006.01)

(52) U.S. Cl.
CPC ........... *G08B 25/12* (2013.01); *H05K 5/0017* (2013.01); *H05K 5/0069* (2013.01); *H05K 5/0221* (2013.01); *H05K 5/0252* (2013.01)

(58) Field of Classification Search
CPC ............. H04M 1/0249; H04M 1/0277; H04M 1/0283; H04M 1/0202; H04M 1/0252;
(Continued)

(56) References Cited

U.S. PATENT DOCUMENTS 3,870,840 A * 3/1975 Rivetta ................... H04M 1/23
200/275
5,819,163 A * 10/1998 Tsukamoto ......... H04M 1/0214
455/575.1
(Continued)

FOREIGN PATENT DOCUMENTS

DE 4418978 12/1995
DE 19744662 6/1999
(Continued)

OTHER PUBLICATIONS

Uponor Google English Translation (NG Uponor et al. "UPONOR" Dec. 31, 2008 retrieved from C3 of IDS Oct. 30, 2023 (Year: 2008).*
(Continued)

*Primary Examiner* — Michael A Matey
(74) *Attorney, Agent, or Firm* — Perkins Coie LLP

(57) ABSTRACT

The invention relates to a support component of a housing of a hazard detection center, preferably of an intrusion alarm, fire detection and/or fire extinguishing center, to an operator control panel module of a hazard detection center, to an indicator and operator control panel arrangement of a hazard detection center, to a housing of a hazard detection center and to a hazard detection center. The invention relates, in particular, to a support component of a housing of
(Continued)

a hazard detection center, preferably of an intrusion alarm, fire detection and/or fire extinguishing center, comprising: first latching means for latching-in connection of the support component to a holding frame arranged on an inner side of a wall of the housing, wherein the first latching means are arranged in such a way that a front side of the support component faces the inner side of the wall of the housing in a latched-in state, second latching means for latching-in connection to a printed circuit board, wherein the printed circuit board is arranged on a rear side, situated opposite the front side, of the support component in the latched-in state, an operating region which has at least one operating element which is designed to be deformed out of a starting position in the direction of the rear side by an action of force.

25 Claims, 13 Drawing Sheets

(58) Field of Classification Search
 CPC ...... H04M 1/026; H04M 1/23; H01H 13/702; H01H 2223/012; H01H 2223/058; H01H 13/70; H01H 13/52; H01H 13/705; H01H 2221/082; H01H 2229/042; H01H 23/04; H01R 12/7011; H01R 12/716; H01R 13/631; H05K 5/0069; H05K 5/069
 See application file for complete search history.

(56) References Cited

U.S. PATENT DOCUMENTS

| | | | | |
|---|---|---|---|---|
| 6,355,890 | B1* | 3/2002 | Kuroda | H04M 1/23 200/345 |
| 6,400,357 | B1* | 6/2002 | Chao | G06F 3/0202 400/472 |
| 11,069,212 | B2 | 7/2021 | Hallwass-Fedder | |
| 2001/0034211 | A1* | 10/2001 | Kuroshima | H01H 13/705 455/575.1 |
| 2006/0079128 | A1* | 4/2006 | Chintala | H04M 1/0252 439/594 |
| 2009/0175018 | A1* | 7/2009 | Zaitsu | H04M 1/185 361/800 |
| 2009/0209301 | A1* | 8/2009 | Lin | H04M 1/0254 455/575.1 |
| 2010/0033915 | A1* | 2/2010 | Hsu | H04M 1/23 361/679.09 |
| 2011/0203913 | A1* | 8/2011 | Chen | H01H 13/702 29/592.1 |
| 2012/0062211 | A1 | 3/2012 | Neal et al. | |
| 2012/0138444 | A1* | 6/2012 | Lee | H04M 1/23 200/520 |
| 2013/0114233 | A1* | 5/2013 | Seo | H04M 1/23 361/809 |
| 2013/0141337 | A1* | 6/2013 | Wang | G06F 3/0202 345/169 |
| 2020/0037459 | A1* | 1/2020 | Liu | G08C 17/02 |

FOREIGN PATENT DOCUMENTS

| | | |
|---|---|---|
| DE | 29819414 U | 4/2000 |
| DE | 102017108751 | 12/2017 |
| DE | 102017107129 | 10/2018 |
| EP | 0158795 | 10/1985 |
| EP | 0841673 | 5/1998 |
| EP | 2703917 | 3/2014 |

OTHER PUBLICATIONS

International Searching Authority, International Search Report with English translation, International Application No. PCT/EP2020/057413 6 pages; May 25, 2020.
International Searching Authority, Written Opinion of the International Searching Authority with English translation, International Application No. PCT/EP2020/057413, 12 pages; May 25, 2020.
NG Uponor et al. "UPONOR" Dec. 31, 2008 (Dec. 31, 2008), pp. 1-34, Retrieved from the Internet: https://www.uponor.de/UponorInterneUDirectDownload?did=I2DC7D8E6CAF48F7A81DDAB6EBF48DFA.

* cited by examiner

SUPPORT COMPONENT OF A HOUSING OF A HAZARD ALERT CENTER AND A HAZARD ALERT CENTER, PREFERABLY AN INTRUDER ALERT, FIRE ALARM AND/OR EXTINGUISHING CONTROL CENTER

PRIORITY CLAIM AND INCORPORATION BY REFERENCE

This application is a 35 U.S.C. § 371 application of International Application No. PCT/EP2020/057413, filed Mar. 18, 2020, which claims the benefit of German Application No. 10 2019 106 868.1 filed Mar. 18, 2019, each of which is incorporated by reference in its entirety.

TECHNICAL FIELD

The invention relates to a support component of a housing of a hazard detection center, preferably of an intrusion alarm, fire detection and/or fire extinguishing center, to an operator control panel module of a hazard detection center, to an indicator and operator control panel arrangement of a hazard detection center, to a housing of a hazard detection center and to a hazard detection center.

BACKGROUND AND SUMMARY OF THE INVENTION

Hazard detection center, such as intrusion alarm, fire detection and/or fire extinguishing center, are known from the prior art. For example, EP 2 703 917 A1 describes a switchgear cabinet for electric sprinkler pumps. DE 10 2017 107 129 A1 discloses a housing of a fire detection and/or extinguishing control station. Hazard detection center generally have a plurality of components which are arranged within a housing. The housing of a hazard detection center is installed in a location which can also be entered by authorized personnel in the event of an alarm.

Hazard detection center usually have an indicator and operator control component. Such an indicator and operator control component can be used, for example, to make configurations and/or to assign disturbances or alarms to an associated detector.

An indicator and operator control component can be arranged in the interior of the housing of the hazard detection center. An arrangement of this kind has the disadvantage that rapid identification of, for example, a location of an alarm or a location of a fire is prevented or made difficult since rescue personnel first have to open the housing before they can determine the location by means of the indicator and operator control component.

It is further possible for indicator and operator control components to be arranged on a side of the housing that is accessible from the outside. In practice, an indicator and operator control component arranged in this way has several disadvantages in respect of installation, start-up and servicing.

The indicator and operator control component usually has a printed circuit board which has necessary functions and circuit elements which are necessary for implementing operator control and indication. Printed circuit boards are distinguished in that they are sensitive to vibrations and other stresses. Printed circuit boards are generally fastened to the indicator and operator control component using screws. The processes of screwing on and moving the printed circuit board frequently lead to damage, and for this reason the printed circuit board and also an apparatus surrounding it have to be of robust design. Furthermore, indicator and operator control components have a large number of labels. The labels indicate, for example, the location of a notification. Such labels generally change over time. One of the reasons for this is changing normative standards. Furthermore, the designations of locations for which a hazard detection center is responsible can change. Labels of this kind are often printed on paper and inserted into a holder.

The German Patent and Trademark Office has searched the following prior art in the priority application relating to the present application: DE 197 44 662 C1, DE 10 2017 108 751 A1, EP 0 841 673 A2 and DE 298 19 414 U1.

Against this background, one object of the present invention is to provide a support component of a housing of a hazard detection center, preferably of an intrusion alarm, fire detection and/or fire extinguishing center, an operator control panel module of a hazard detection center, an indicator and operator control panel arrangement of a hazard detection center, a housing of a hazard detection center and a hazard detection center which reduce or eliminate one or more of the disadvantages mentioned. A further object of the invention is to provide a solution which allows for easier servicing of a hazard detection center, such as an intrusion alarm, fire detection and/or fire extinguishing center for example. A further object of the present invention is to allow for a hazard detection center of more robust design. A particular object of the invention is to provide a solution which protects a printed circuit board of a hazard detection center against damage due to external actions of force, in particular due to warpage. A further object of the invention is to provide a solution which protects a printed circuit board of a hazard detection center against electrostatic discharges (ESD).

According to one aspect of the invention, the object mentioned at the outset is achieved by a support component of a housing of a hazard detection center, preferably of an intrusion alarm, fire detection and/or fire extinguishing center, comprising: first latching means for latching-in connection of the support component to a holding frame arranged on an inner side of a wall of the housing, wherein the first latching means are arranged in such a way that a front side of the support component faces the inner side of the wall of the housing in a latched-in state, second latching means for latching-in connection to a printed circuit board, wherein the printed circuit board is arranged on a rear side, situated opposite the front side, of the support component in the latched-in state, an operating region which has at least one operating element which is designed to be deformed out of a starting position in the direction of the rear side by an action of force in order to transmit an operating force to the printed circuit board, wherein the operating element returns to the starting position when the action of force is withdrawn.

The support component comprises the first latching means, the second latching means, the operating region and the indicator region. The first latching means are preferably designed to arrange and/or to fasten the support component on/to a housing. The latching means can further be designed in such a way that they latch in on a holding frame of a housing of a hazard detection center. The latching-in effect of the first latching means can be understood in such a way that an interengaging connection is formed. This interengaging connection can be made, for example, by a coupling operation, a hooking-in operation, a hanging operation, a snapping-in operation, an engaging operation and/or a clicking-shut operation.

The support component preferably has a front side and a rear side. The front side of the support component preferably faces an inner side of the wall of the housing of the hazard detection center when operating as intended. The front side of the support component can further be designed in such a way that it is accessible at the inner side of the wall of the housing from an outer side of the wall of the housing, for example through openings in the wall of the housing, in the state in which it is latched in as intended. The front side of the support component is preferably arranged such that it is visible and/or can be operated from an outer side of the wall.

The second latching means are preferably arranged and designed such that a printed circuit board can be arranged on and can be fastened to the rear side of the support component by means of said second latching means. The rear side of the support component is preferably designed in such a way that a printed circuit board can be arranged on it. The rear side of the support component preferably has a printed circuit board section in which a printed circuit board can preferably be arranged. The second latching means are arranged on the support component in such a way that they can preferably couple a printed circuit board to the support component on the rear side of the support component, preferably on the printed circuit board region. The second latching means are preferably different from the first latching means.

The first latching means are preferably arranged on two opposite sides of the support component. The second latching means are further preferably arranged on two opposite sides which are different from the sides of the first latching means. The sides on which the first latching means are arranged can further be oriented orthogonally to the sides on which the second latching means are arranged. The support component can also have a collar which projects from the rear side. It is further preferred that the first latching means are arranged on an outwardly directed section of the collar. The second latching means are further preferably arranged on an inwardly protruding section of the collar.

The operating region has the at least one operating element. The operating element is designed to be deformed out of a starting position in the direction of the rear side by an action of force. This preferably means that the operating element is moved in an operating direction by the action of force, wherein the operating direction is oriented from the outer side to the inner side. The operating element can preferably be moved in the direction of the operating direction in such a way that the operating element can be moved from the starting position to an operating position in such a way that the operating force can be transmitted to a printed circuit board arranged on the rear side of the support component in the operating position. The operating element returns from the operating position to the starting position due to a spring action, for example. The operating element is preferably arranged on the operating region in such a way that the spring action is already implemented by the arrangement itself. As an alternative, the spring action can be rendered possible by an additional element, for example a spring element.

The present invention is based on the knowledge that existing hazard detection center often have limited serviceability. Furthermore, the invention is based on the knowledge that servicing of hazard detection center is often associated with a high level of expenditure. For example, the above-described support component of a housing of a hazard detection center allows for the support component with a printed circuit board arranged on it to be exchanged using one hand and, in particular, without tools. On account of this, it is possible for a technician to use one hand to unlatch and move the support component and to use the other hand to carry out servicing work. For example, labels between the support component and the housing can be exchanged. For example, a servicing technician can use one hand to detach the support component from the housing and use the other hand to exchange a labeling element between the support component and the housing. Labels on hazard detection center are intended to be exchanged during the service life of such a hazard detection center. For example, the language may be changed.

Furthermore, direct contact is not made with the printed circuit board during servicing work, as a result of which the protection against electrostatic discharges is increased. The generally sensitive printed circuit boards are arranged on the support component and can be removed from the housing together with the support component. Consequently, the printed circuit board is subject to less stress. Furthermore, the above-described support component increases the possibility of a modular structure. Furthermore, the support component allows for efficient mounting since the support component with a printed circuit board arranged in it can be mounted as a module and can be arranged in the hazard detection center as a module only later.

Furthermore, the support component itself can also be quickly and easily exchanged on the housing by way of the first latching means in such a way that the servicing and mounting complexity is reduced. For example, screwing is not required.

In a preferred design variant of the support component, it is provided that said support component comprises an indicator region which has at least one light passage which is designed to guide an optical signal of the printed circuit board to the front side of the support component. The indicator region has the at least one light passage. The light passage is designed to guide an optical signal of the printed circuit board through to the front side of the support component. The light passage can be provided, for example, as a cutout in the support component. As an alternative, the light passage can be provided for by a transparent material. Furthermore, the light passage can be formed by coupling out a light guide.

In a preferred design variant of the support component, it is provided that said support component has guide means for guiding an exchangeable labeling element, preferably a paper or film sign, wherein the guide means are arranged on the front side of the support component in such a way that the labeling element is arranged between the support component and the housing wall in a latched-in state of the first latching means.

The labeling element is preferably arranged in such a way that it is visible from an outer side of the housing. The guide means of the support component preferably orient the labeling element in a predefined position. The guide means preferably form, with a labeling element, a labeling region. The labeling region preferably comprises different labeling elements. A labeling element is preferably arranged on an operating element and/or adjacent to an operating element.

The guide means allow for the arrangement of a labeling element in a predefined position, so that no additional expenditure on orientation or reduced additional expenditure on orientation is required. On account of the first latching means of the support component, said support component can be separated from the housing with a low level of complexity as already explained above. In combination with the guide means, the labeling element can be exchanged with a low level of complexity. For this purpose, the guide means preferably have a horizontal guide. Furthermore, the guide means preferably have a vertical guide. The guide means can have vertical stops and/or horizontal stops.

In a further preferred design variant of the support component, it is provided that the support component is of one-piece design. The one-piece design of the support component further reduces the mounting complexity of the housing of the hazard detection center. Furthermore, the one-piece design of the support component allows for efficient manufacture by molding processes. Furthermore, it is preferred that the support component comprises plastic or consists of plastic and is preferably produced using an injection molding process.

The support component can be used individually in a large number of even different hazard detection center. On account of this, it is necessary to mount a large number of support components. On account of this, the support component is preferably designed in such a way that it can be produced using an injection molding process. Furthermore, the design of said support component from plastic is cost-effective. Furthermore, it is possible to design the operating element from plastic, so that the abovementioned spring action is rendered possible without further components.

A further preferred development of the support component is distinguished in that the guide means allow for guidance of the labeling element in the same direction in which latching in is implemented by means of the first latching means. Furthermore, it is preferred that the first latching means comprises a spring, formed on a lower side of the support component, and a latching finger, formed on the upper side of the support component, which has an outwardly directed latching lug.

The latching finger is preferably designed in such a way that it can be at least partially arranged in an opening of the holding frame. The latching finger preferably has a latching lug which can be arranged in the opening of the holding frame. The arrangement of the latching finger in such an opening allows for fixing of the support component. By way of the spring arranged on the lower side situated opposite the upper side, the support component can likewise be connected to the housing, preferably to the holding frame, on this lower side. The spring is preferably designed in such a way that it can form a latching connection. For example, a length of the latching finger can be configured in such a way that the latching finger protrudes beyond a height of the holding frame in the latched-in state, as a result of which the latching finger can be readily moved by a technician.

Furthermore, it is preferred that the latching finger of the first latching means is designed in such a way that the latching connection can be released using one hand and without tools. Furthermore, it is preferred that the latching connection of the first latching means is made by pivoting about an axis which is defined by the spring. The spring is preferably designed in such a way that pivoting about a specific angle is rendered possible. The support component further comprises in each case two springs on the bottom side and in each case two latching fingers on the top side.

In a further preferred design variant of the support component, it is provided that the second latching means have latching lugs arranged opposite and formed on inner side faces of the support component, preferably in each case two formed on a left-hand and right-hand side face. The inner side faces are preferably formed by the collar. The latching lugs are further preferably designed as elastically projecting elements. The pivot axis of the latching lugs is preferably orthogonal to a pivot axis of the latching fingers of the first latching means.

Furthermore, it is preferred that a fixing element for horizontally fixing the printed circuit board latched into the second latching means is arranged on the inner side faces. The fixing element is preferably plastically deformable. The plastic deformation is irreversible. The plastic deformation of the fixing element preferably takes place when the printed circuit board is arranged on the support component and preferably during, before or after latching in with the second latching means. Owing to a fixing element of this kind, a printed circuit board can be arranged on the support component without play. The printed circuit board is therefore arranged on the support component in a more robust manner and the risk of vibrations that damage the printed circuit board is reduced. Furthermore, noise caused by play is avoided owing to an abovementioned fixing element. The risk of mechanical damage during installation due to deformation, in particular when using a plug-in connector, or due to tensioning, in particular when fixing a printed circuit board by means of screws, is also reduced.

Furthermore, it is preferred that the support component has a receptacle for a spacer element. The receptacle for the spacer element is preferably arranged on the rear side of the support component. In a simple embodiment of the spacer element, it is designed as a positioning aid. For example, elastomers can be arranged, preferably adhesively bonded, in the receptacle in order to establish a prestress between the rear side of the support component and a printed circuit board to be fastened to it, so that noise is avoided or reduced. The spacer element can be of conical design, for example.

Furthermore, it is preferred that the operating region has a plurality of operating elements, preferably a plurality of operating elements arranged in two columns, and wherein one, two or several or each of the operating elements has/have at least one associated light passage. The at least one associated light passage can be arranged, for example in the operating state, in such a way that a diode of a printed circuit board is arranged behind said at least one associated light passage. Furthermore, it is preferred that one, two or several or each of the operating elements has two associated light passages.

The light passage or one of the light passages is preferably arranged laterally next to an operating element. The two associated light passages further preferably form a light module which is arranged laterally next to an operating element. It is further preferred that one or both light passages have a color element. The color element is of at least partially transparent design, for example. The color element can be designed as a colored glass, preferably a plexiglass. Furthermore, it is preferred that said color element allows for a red and/or a yellow light. In hazard detection center for example, a red light can be emitted for a fire and yellow can be emitted for a disturbance.

A further preferred development of the support component provides that the operating element has a neck section and a pressure section, adjoining said neck section, with a larger cross section, wherein the neck section is elastically deformed when pressure is exerted onto the pressure section.

The neck section preferably connects the pressure section to the rest of the support component. The pressure section preferably has a round cross section. The pressure section is preferably at a spacing from the rest of the support component. The neck section, which connects the pressure section to the rest of the support component, is preferably arranged and designed in such a way that the pressure section can be pressed and therefore can be moved from a starting position to an operating position. The neck section is preferably designed as a relatively slim section. The neck section can merge with the pressure section. Furthermore, it is preferred that the pressure section has a curved shape, preferably convexly curved in the direction of the front side.

In a further preferred development of the support component, it is provided that the guide means have a plurality of guide lugs arranged substantially parallel to the front side of the support component, wherein at least one of the guide lugs defines a stop counter to the guide direction, and preferably a bottom side of at least one guide lug is at a smaller distance from the rear side than the front side is from the rear side in the horizontal direction. An arrangement of this kind can lead to prestressing of the labeling element.

As an alternative, the guide lugs are preferably at a distance from the front side in the vertical direction in such a way that there is a clear height between a bottom side of the guide lugs and the front side. The clear height is preferably selected in such a way that a labeling element can be arranged between the bottom side of the guide lug and the front side. It is further preferred that the support component has a cutout for a display arranged on the printed circuit board. The support component preferably has a dimension in the vertical direction of greater than 5 cm, greater than 10 cm, greater than 15 cm, greater than 20 cm or greater than 25 cm. In particular, it is preferred that the support component has a dimension in the vertical direction of between 17 cm and 18 cm. The horizontal dimension in the direction of the width is preferably greater than 5 cm, greater than 7.5 cm or greater than 10 cm, wherein one region is particularly preferably between 8 cm and 9 cm. The collar preferably projects by more than 0.5 cm, more than 1 cm, more than 1.5 cm, more than 2 cm or more than 3 cm, wherein it is in particular preferred that the collar projects by between 27 cm and 28 cm.

According to a further aspect of the invention, the object mentioned at the outset is achieved by an operator control panel module of a hazard detection center, comprising a support component according to one of the preceding design variants and a printed circuit board latched into the second latching means.

The operator control panel module is therefore a premountable structural unit which can be arranged in a housing of a hazard detection center. The printed circuit board is preferably arranged on the rear side of the support component. The printed circuit board is further preferably surrounded by a collar of the support component, wherein it is preferred that the second latching means are located on the collar and the second latching means hold the printed circuit board from there. A spacer element, which compensates for or reduces any play between the printed circuit board and the rear side of the support component, is further preferably arranged between the printed circuit board and the rear side of the support component. Furthermore, it is preferred that the printed circuit board is arranged without play in the vertical direction and in the lateral horizontal direction by fixing elements. Fixing elements of this kind allow for a simple design of the second latching means since these do not absolutely necessarily have to be designed for fixing the printed circuit board without play.

The printed circuit board preferably comprises at least one pressure-sensitive element which is designed for generating an electrical signal. The at least one pressure-sensitive element is preferably arranged on the printed circuit board in such a way that said pressure-sensitive element is operated by the operating force of the operating element and generates the electrical signal.

According to a further aspect of the present invention, the object mentioned at the outset is achieved by an indicator and operator control panel arrangement of a hazard detection center, comprising: an indicator and operator control panel, a holding frame, and at least one operator control panel module according to the previous aspect.

In a preferred development, it is provided that the indicator and operator control panel has a film, wherein the film is arranged on a front side or a rear side of the indicator and operator control panel. The film can be adhesively bonded onto the indicator and operator control panel. The film preferably has symbols for identifying indicator and operator control elements. A film of this kind has the advantage that, with the operator control elements fully functioning, the ingress of dirt into the indicator and operator control panel is prevented or at least reduced. The film further has the advantage that an upper edge of the labeling element can be trapped between the indicator and operator control panel and the film.

The indicator and operator control panel can be designed, for example, as a panel. The indicator and operator control panel preferably has apertures which are arranged and designed in such a way that they allow access to the operating elements of the support component from an outer side of the indicator and operator control panel. The indicator and operator control panel further has the holding frame on an inner side that faces away from its outer side. The holding frame is designed in such a way that it corresponds to the first latching means, preferably in such a way that the support component can be arranged on the holding frame by means of the first latching means. The holding frame preferably comprises a first holding frame section and a second holding frame section which are further preferably arranged on the indicator and operator control panel with a vertical spacing. The support component is preferably arranged between the first holding frame section and the second holding frame section in the vertical direction. Openings corresponding to the first latching means are preferably arranged on the first holding frame section and the second holding frame section.

It is further preferred that the holding frame is reversibly fastened, preferably screwed, on an inner side of the indicator and operator control panel and/or the holding frame has a passage opening for arranging fastening means for a cable bundle, preferably cable harness.

This arrangement is based on the knowledge that injection-molded parts deform when they are adhesively bonded to one another. As a result, it is advantageous to screw a first injection-molded part to a second injection-molded part. The holding frame preferably has a first position for a first operator control panel module and a second position for a second operator control panel module. An opening is preferably arranged on the holding frame between the first position and the second position. The opening is further preferably provided in the region of screws for fastening the holding frame to the indicator and operator control panel. The opening is preferably arranged and designed in such a way that a cable tie or another means for fastening a cable can be guided through said opening. A cable bundle, preferably a cable harness, can be fastened to the holding frame via said opening.

Furthermore, the object mentioned at the outset is achieved by a housing of a hazard detection center, comprising: a housing section with at least one indicator and operator control panel arrangement according to the above-described aspect.

The housing preferably comprises a second printed circuit board which comprises a central computer unit or is designed as such. The second printed circuit board is preferably designed in order to control an indicator, in particular a display, and LED indicators.

The object mentioned at the outset is further achieved by a hazard detection center, fire detection and/or extinguishing control station having a housing according to the above-described aspect, wherein an associated printed circuit board is latched into each of the support components, and printed circuit boards of support components arranged next to one another are directly connected to a connecting cable for data transmission.

The hazard detection center is preferably developed in such a way that each of the printed circuit boards is designed to indicate the state of a plurality of peripheral devices connected in a signal-conducting manner to the hazard detection center, preferably a plurality of detector groups of a fire detection and/or extinguishing control station. Furthermore, it may be preferred that the designation of the detector groups or components is implemented by means of the labeling elements of the respective support components

BRIEF DESCRIPTION OF THE DRAWINGS

For further advantages, design variants and design details of these further aspects and the possible developments thereof, reference is also made to the above description relating to the corresponding features and developments of the support component.

Preferred embodiments of the invention will be explained by way of example on the basis of the appended figures, in which.

MODE(S) FOR CARRYING OUT THE INVENTION

In the figures, identical or substantially functionally identical or similar elements are denoted by the same reference signs.

Figure 1:
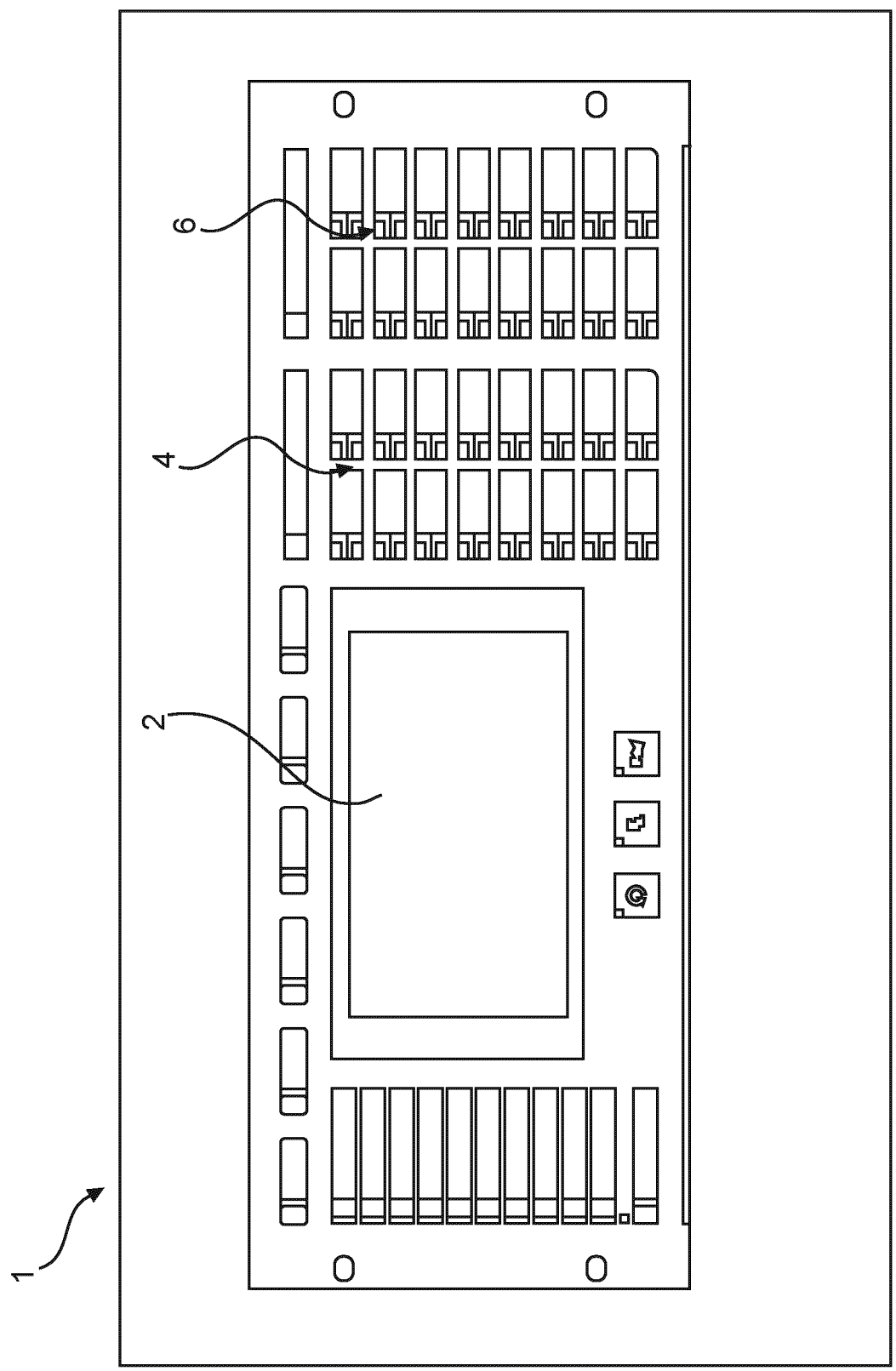
FIG. 1 shows a schematic, three-dimensional view of a housing of a hazard detection center.

FIG. 1 shows a schematic, three-dimensional view of a housing of a hazard detection center 1. The housing of the hazard detection center 1 has a display screen 2. Furthermore, the housing has a first pushbutton region 4 and a second pushbutton region 6. Furthermore, the housing can have further pushbutton regions, for example a third pushbutton region, a fourth pushbutton region, a fifth pushbutton region, a sixth pushbutton region and a seventh pushbutton region. A respective support component is arranged behind these pushbutton regions 4, 6, as will be explained in further detail below. A respective operating element of the support components is preferably located behind the individual pushbuttons of the pushbutton regions 4, 6.

Figure 2:
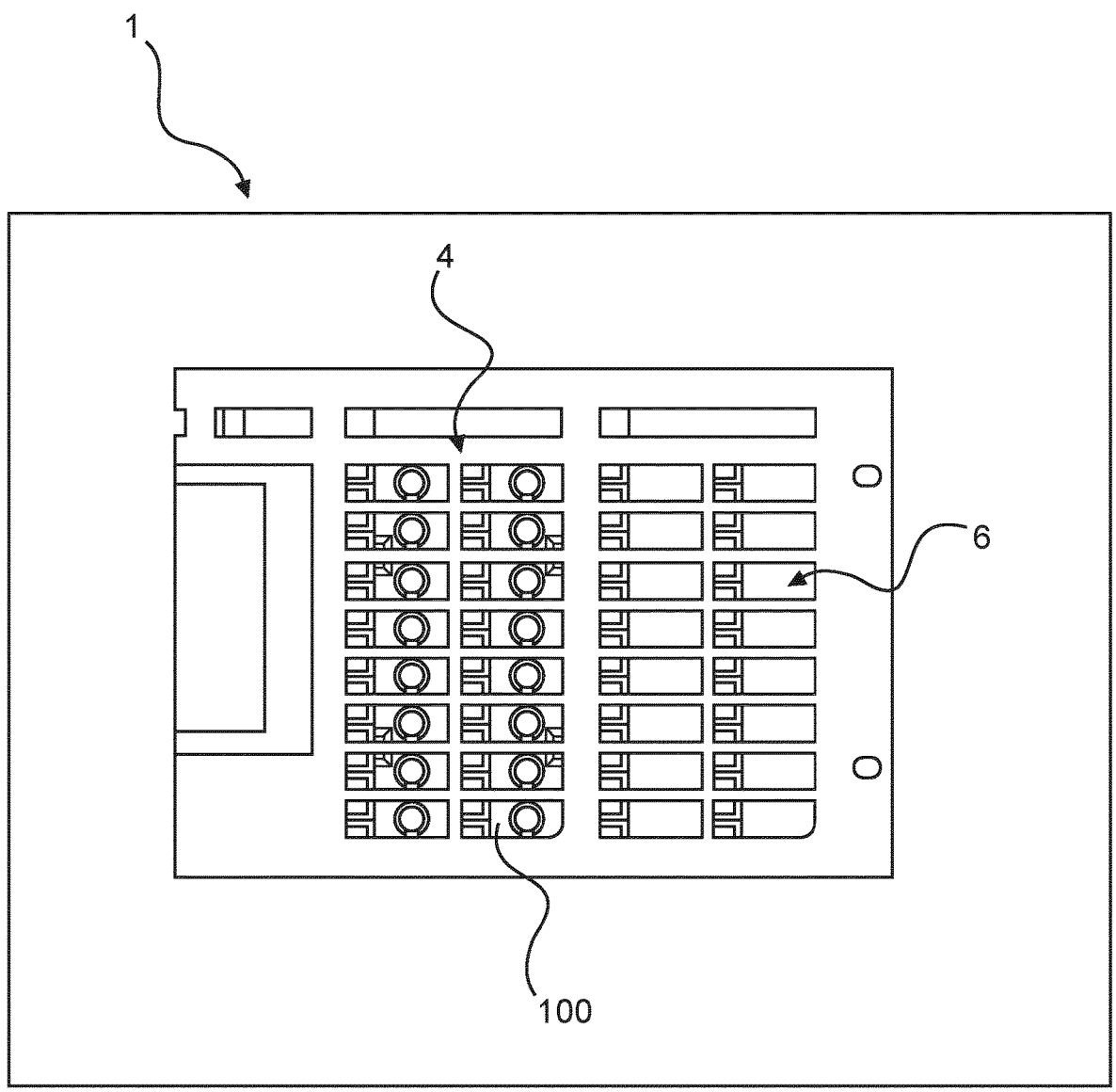
FIG. 2 shows a schematic, two-dimensional partial view of the housing.

FIG. 2 shows a schematic, two-dimensional partial view of the hazard detection center. The first pushbutton region 4 is illustrated in a broken manner here, so that the support component 100 arranged behind the first pushbutton region 4 can be seen through the cutouts in the housing. The circular element arranged behind each pushbutton is an operating element of the support component 100.

Figure 3:
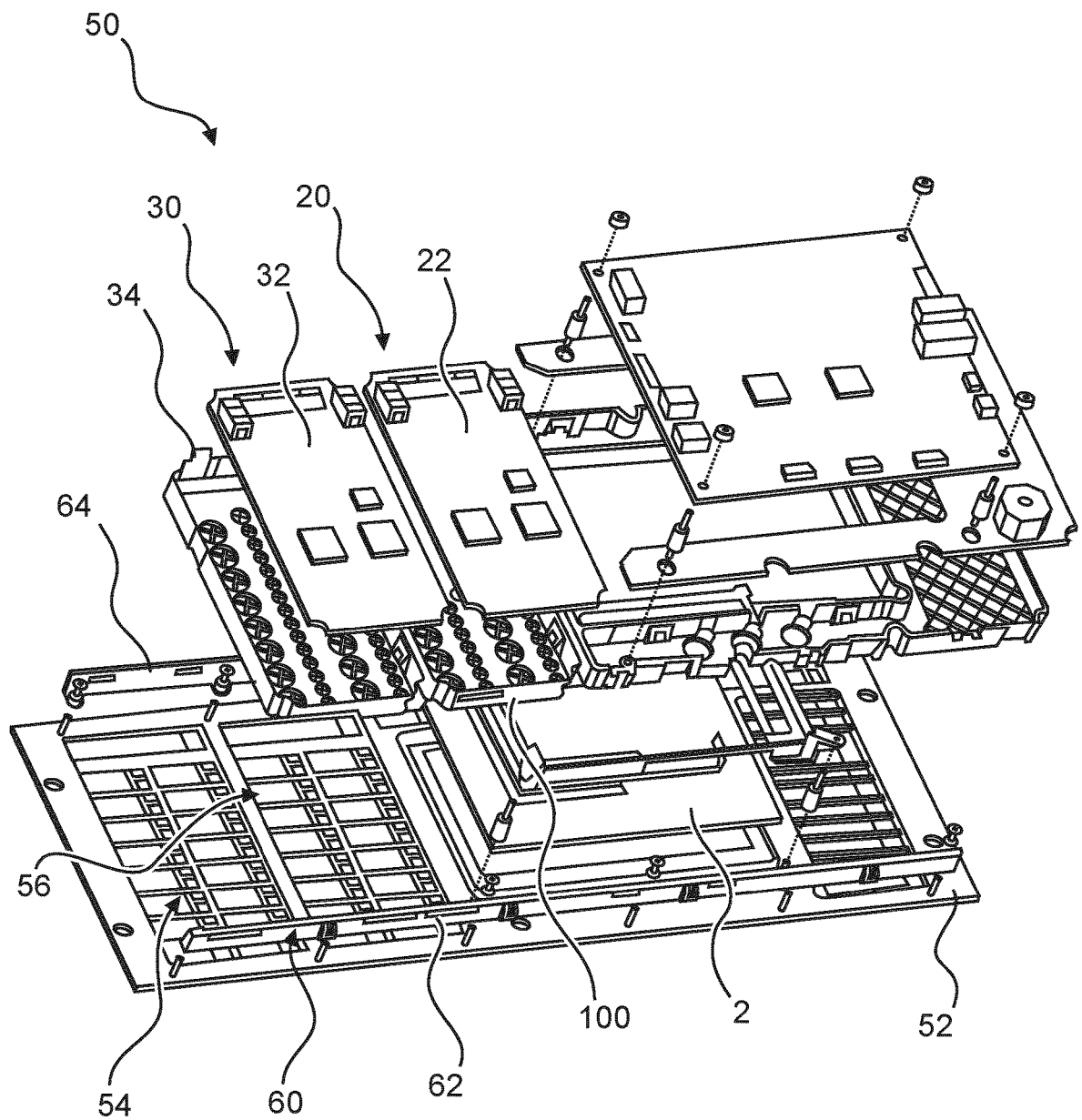
FIG. 3 shows a schematic exploded drawing of an indicator and operator control panel arrangement.

FIG. 3 shows a schematic exploded drawing of an indicator and operator control panel arrangement. The indicator and operator control panel arrangement 50 comprises an indicator and operator control panel 52, a first operator control panel module 20 and a second operator control panel module 30. The indicator and operator control panel 52 further has a holding frame 60. The holding frame 60 comprises a first holding frame section 62 and a second holding frame section 64. The first holding frame section 62 is arranged along a first edge of the indicator and operator control panel 52. The second holding frame section 64 is arranged on an edge, situated opposite said first edge, of the indicator and operator control panel 52. Consequently, the first holding frame section 62 and the second holding frame section 64 are arranged substantially parallel to one another. The indicator and operator control panel 52 has first operating openings 54 and second operating openings 56. The operating openings 54, 56 are arranged on the indicator and operator control panel 52 in such a way that operator control panel modules 20, 30 arranged on the rear side can be reached from the outer side.

The first operator control panel module 20 comprises the first support component 100 and a first printed circuit board 22. The first printed circuit board 22 is arranged on a rear side of the first support component 100 by means of second latching means, which are explained in yet further detail below. The second operator control panel module 30 has a second printed circuit board 32 and a second support component 34, wherein the second printed circuit board 32 is arranged on the second support component 34 by way of second latching means. The operator control panel modules 20, 30 are arranged on the holding frame 60 by means of first latching means explained in yet further detail below.

Figure 4:
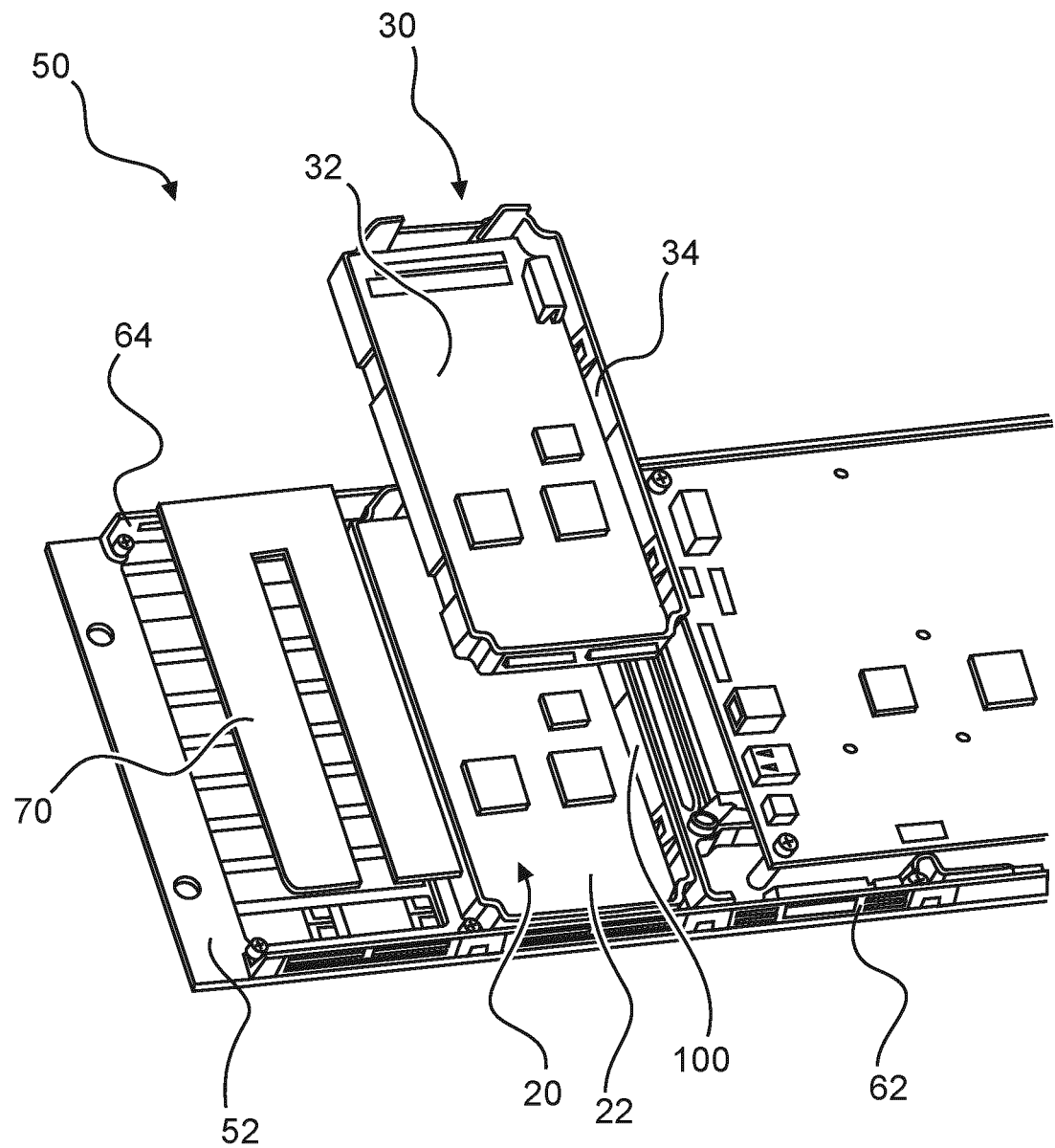
FIG. 4 shows a schematic, three-dimensional view of the indicator and operator control panel arrangement from FIG. 3.
Figure 5:
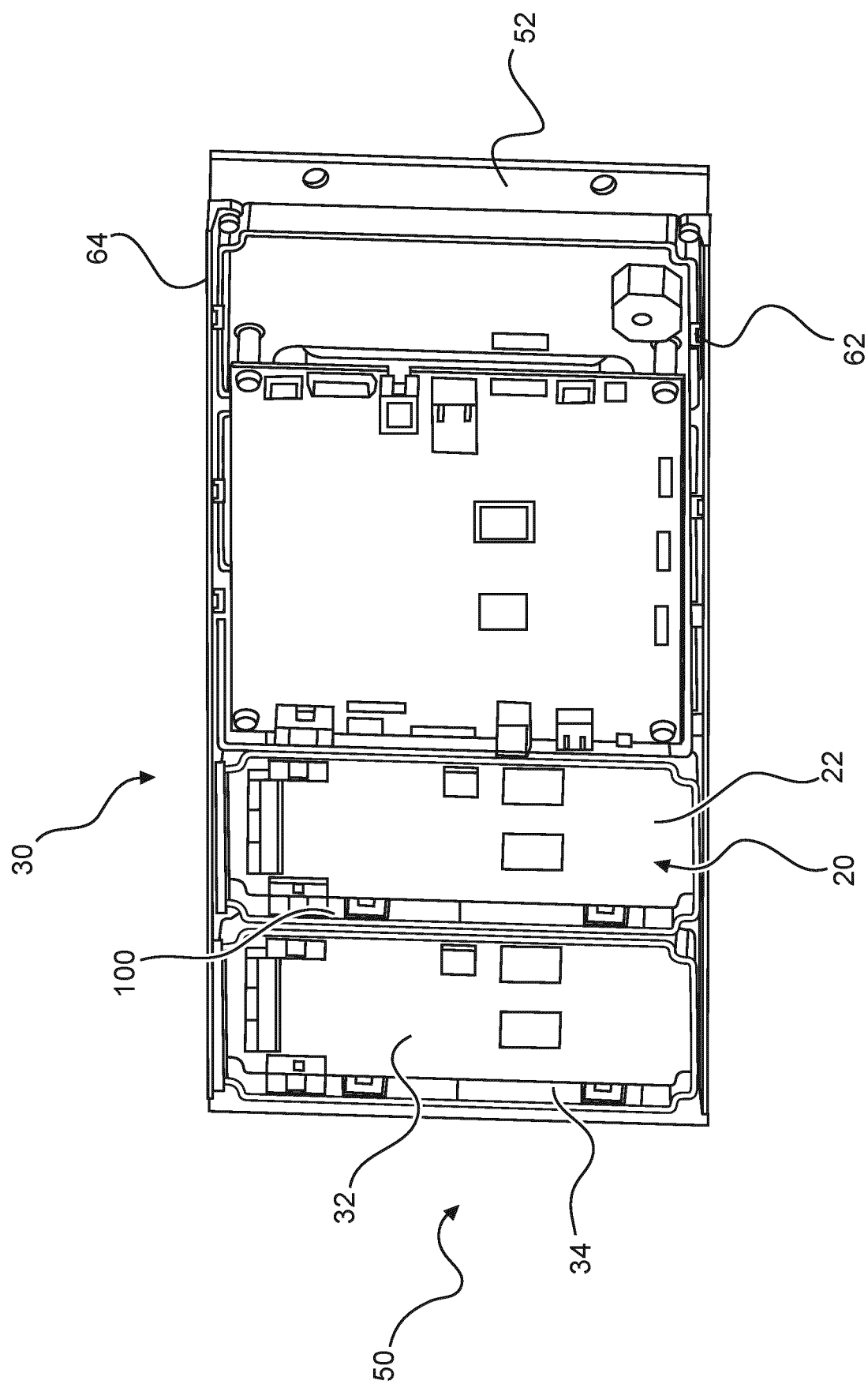
FIG. 5 shows a further schematic, three-dimensional view of the indicator and operator control panel arrangement from FIG. 3.
Figure 6:
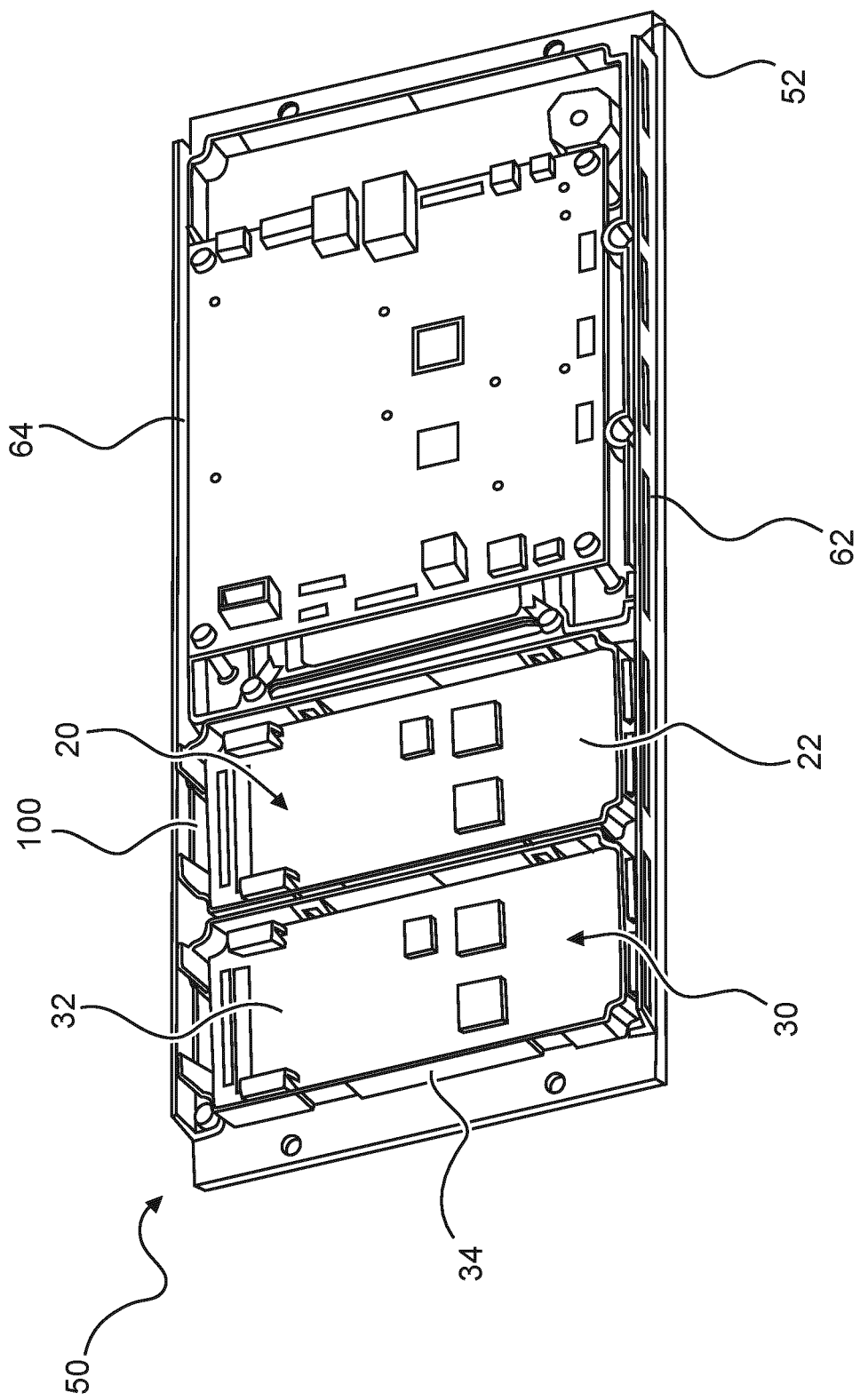
FIG. 6 shows a further schematic, three-dimensional view of the indicator and operator control panel arrangement from FIG. 3.
Figure 7:
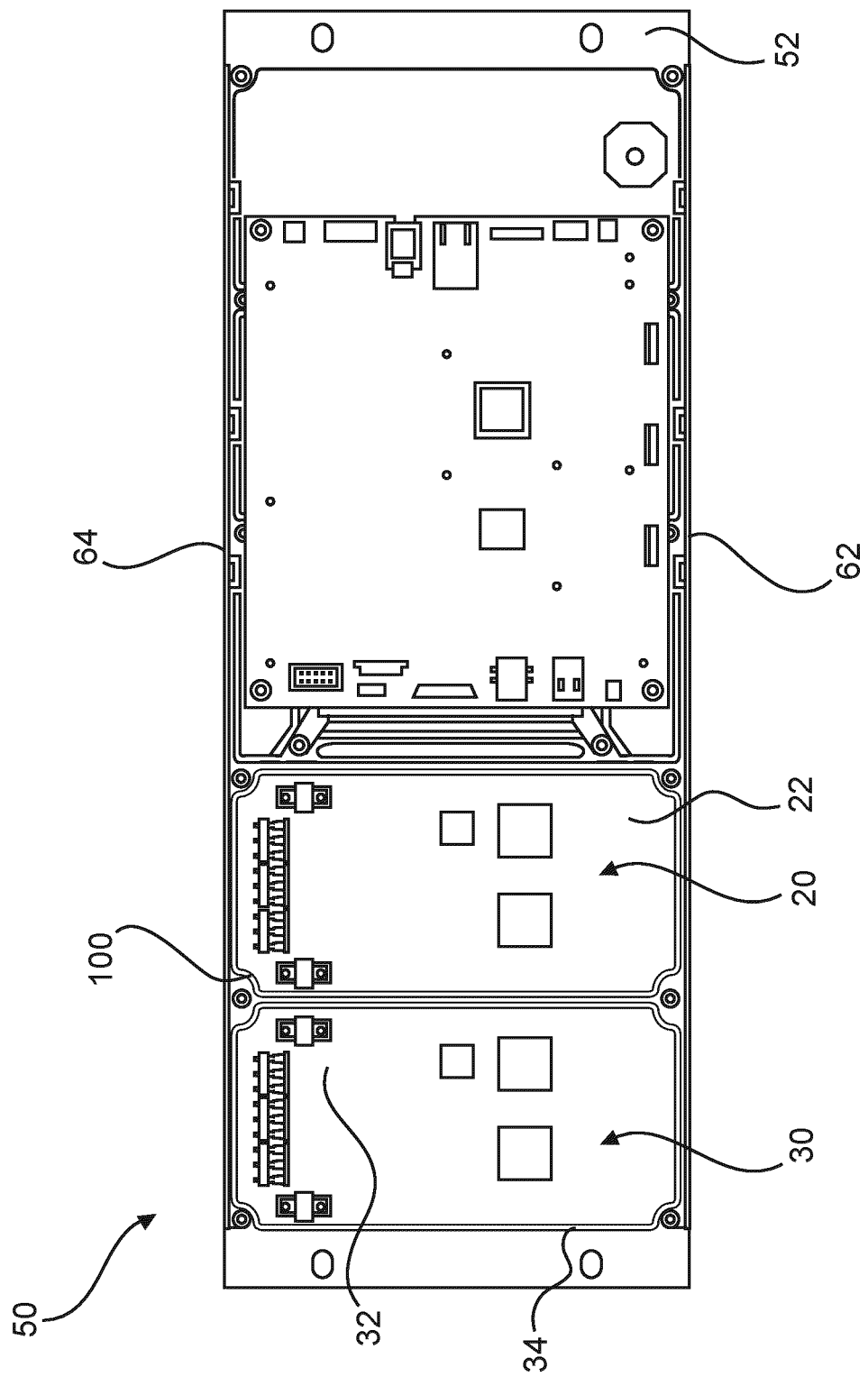
FIG. 7 shows a schematic, three-dimensional view of the indicator and operator control panel arrangement from FIG. 3.

FIG. 4 shows the arrangement of a labeling element 70 on the hazard detection center 1. The labeling element 70 is arranged between the second operator control panel module 30 and the indicator and operator control panel 52. Contact can be made with the labeling element 70 through the first operating openings 54 from an outer side, which faces away from the rear side shown here, of the indicator and operator control panel 52. FIGS. 5-7 show the ready-to-install indicator and operator control panel arrangement 50, wherein the first operator control panel module 20 and the second operator control panel module 30 are latched in on the first holding frame section 62 and the second holding frame section 64.

Figure 8:
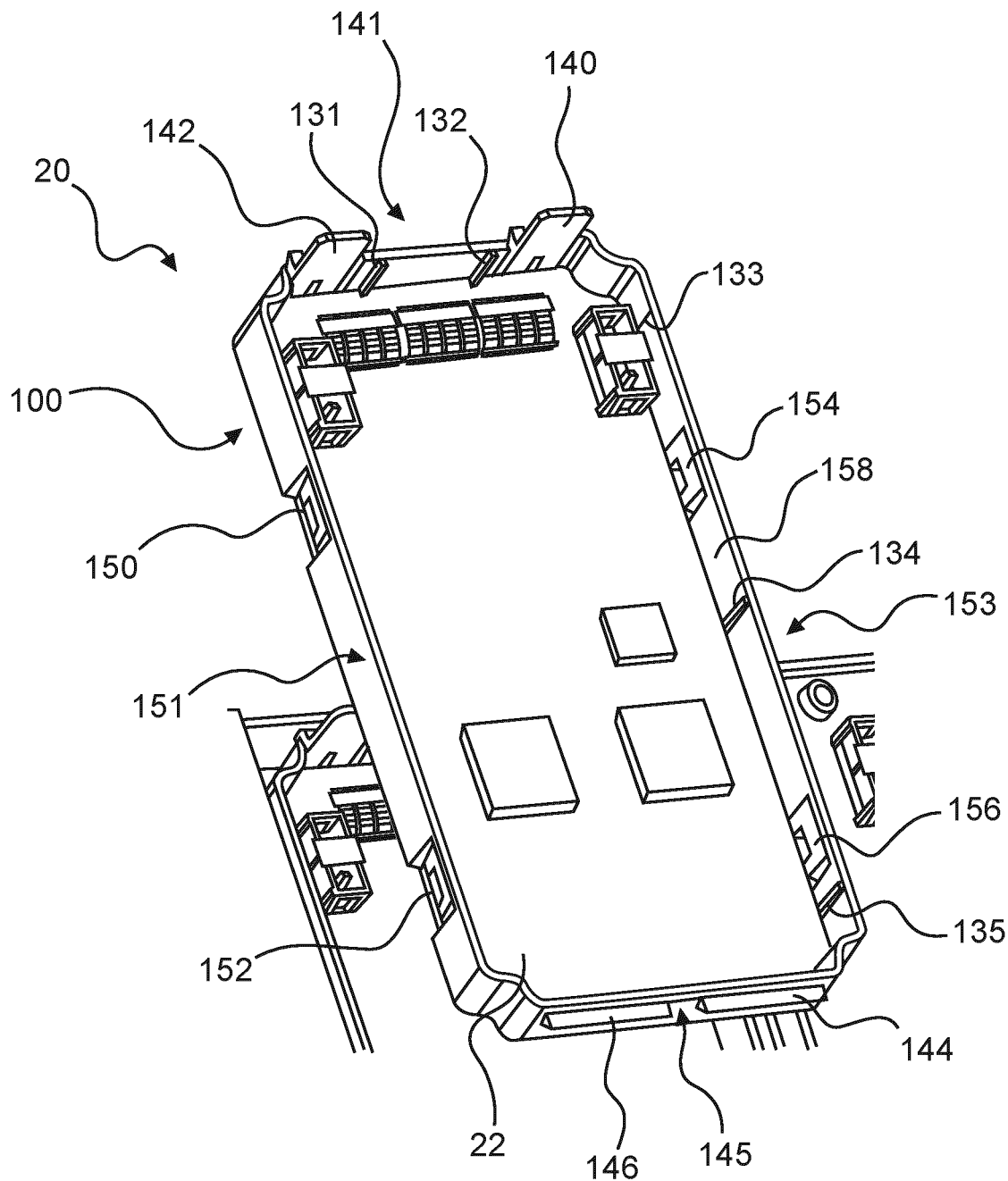
FIG. 8 shows a schematic, three-dimensional view of an operator control panel module.

FIG. 8 shows a schematic, three-dimensional view of an operator control panel module. The first support component 100 of the first operator control panel module 20 extends from an upper support side 141 to a lower support side 145 in the vertical direction. The first support component 100 extends from a left-hand side 151 to a right-hand side 153 vertically in relation to the extent between the lower and upper support sides 141, 145. The first support component 100 has a base plate on which a collar 158 is arranged. The collar 158 forms side walls and, together with the base plate, a section which is substantially closed on five sides and in which the printed circuit board 22 can be arranged from the open side. The first support component 100 has first latching means 140, 142 on the upper support side 141. The first latching means 140, 142 are designed as latching fingers which have an outwardly directed latching lug. The first latching means 140, 142 can be moved partially freely from the collar 158. Two further first latching means 144, 146 are arranged on the lower support side 145.

In each case two second latching means 150, 152, 154, 156 are arranged on the left-hand side 151 and on the right-hand side 153. As can be seen in FIG. 8, the printed circuit board 22 latches in on the first support component 100 by way of the second latching means 150, 152, 154, 156. The support component 100 has second fixings 131-135 which allow for a play-free arrangement of the printed circuit board 22. The second fixings 131-135 can be designed as plastically deformable projections from the inner sides of the collar 158. The second fixings 131-135 are arranged and designed in such a way that they form a press-fit with the printed circuit board 22. Furthermore, the second fixings 131-135 are designed as cutting fixings which are arranged and designed to cut into a printed circuit board. Therefore, the fixing is implemented by plastic deformation of the printed circuit board 22. The fixings 131-135 preferably comprise a first material and the printed circuit board 22 preferably comprises a second material, wherein the material hardness of the first material is greater than the material hardness of the second material.

Figure 9:
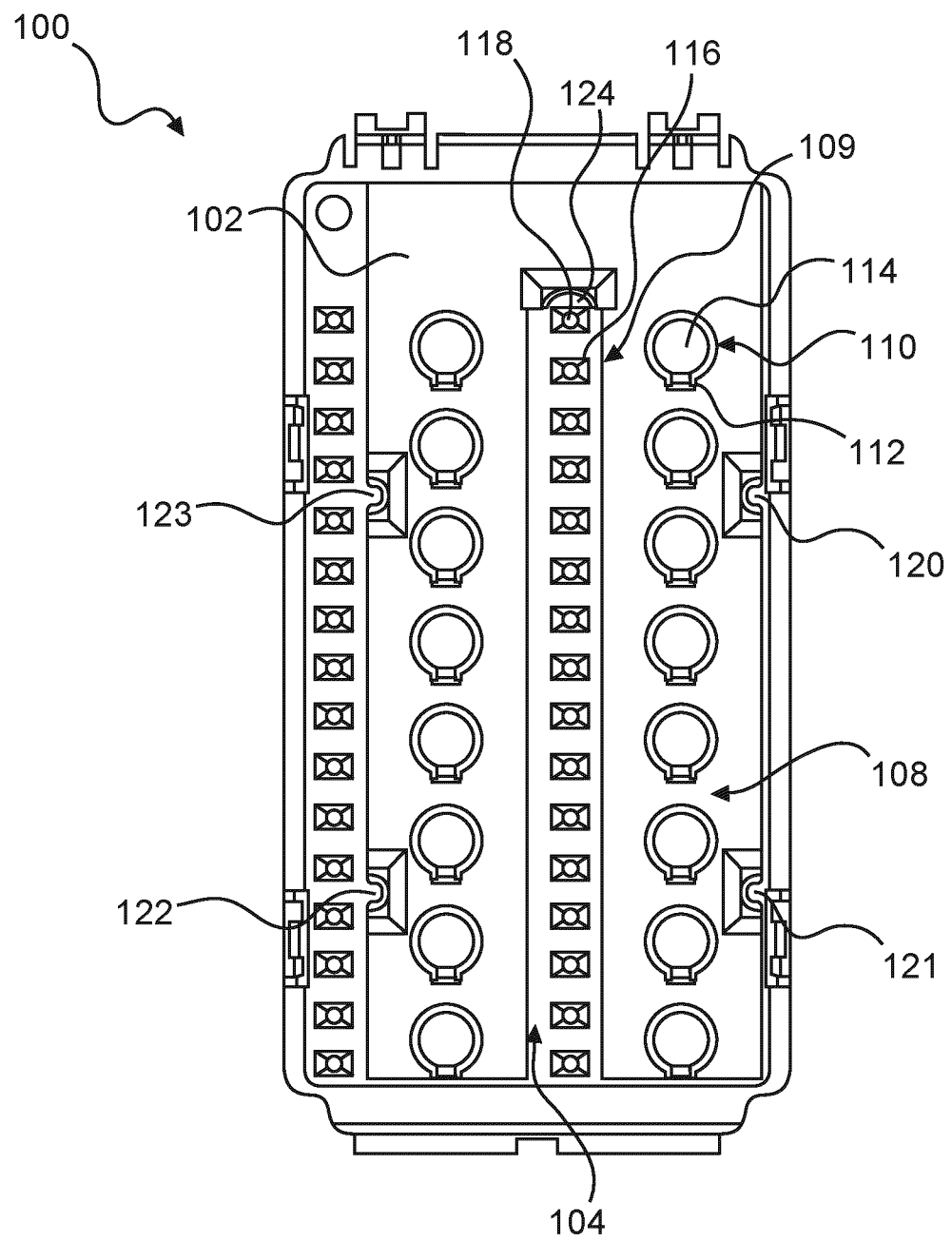
FIG. 9 shows a schematic, three-dimensional view of a front side of the support component.

FIG. 9 shows a schematic, three-dimensional view of a front side of the support component. The support component 100 has a base plate 102. The base plate 102 forms a front side 104 and a rear side 106, shown in FIG. 11.

The first support component 100 has a total of 16 operating elements in an operating region 108. Furthermore, the support component 100 comprises a first indicator region 109 with light passages and a second indicator region, arranged next to the first indicator region 109, with light passages. Two light passages are associated with each operating element. By way of example for the operating elements, the design of the operating elements is illustrated with reference to the operating element 110 shown at the top right. A first light passage 116 and second light passage 118 are associated with the operating element 110. The operating element 110 comprises a pressure section 114 and a neck section 112. The pressure section 114 is spaced apart from the base plate 102 of the support component 100 by a gap. The connection of the pressure section 114 to the base plate 102 is realized by the neck section 112.

The first support component 100 furthermore has a first guide means 120, a second guide means 121, a third guide means 122 and a fourth guide means 123. The guide means 120-123 are arranged in such a way that a labeling element can be fixed to the first support component 100 by means of said guide means. The guide means 120-123 shown here are designed as guide lugs. A fixing element 130 is further arranged on the base plate 102, which fixing element is intended to reduce or eliminate play between the printed circuit board and the support component.

Figure 10:
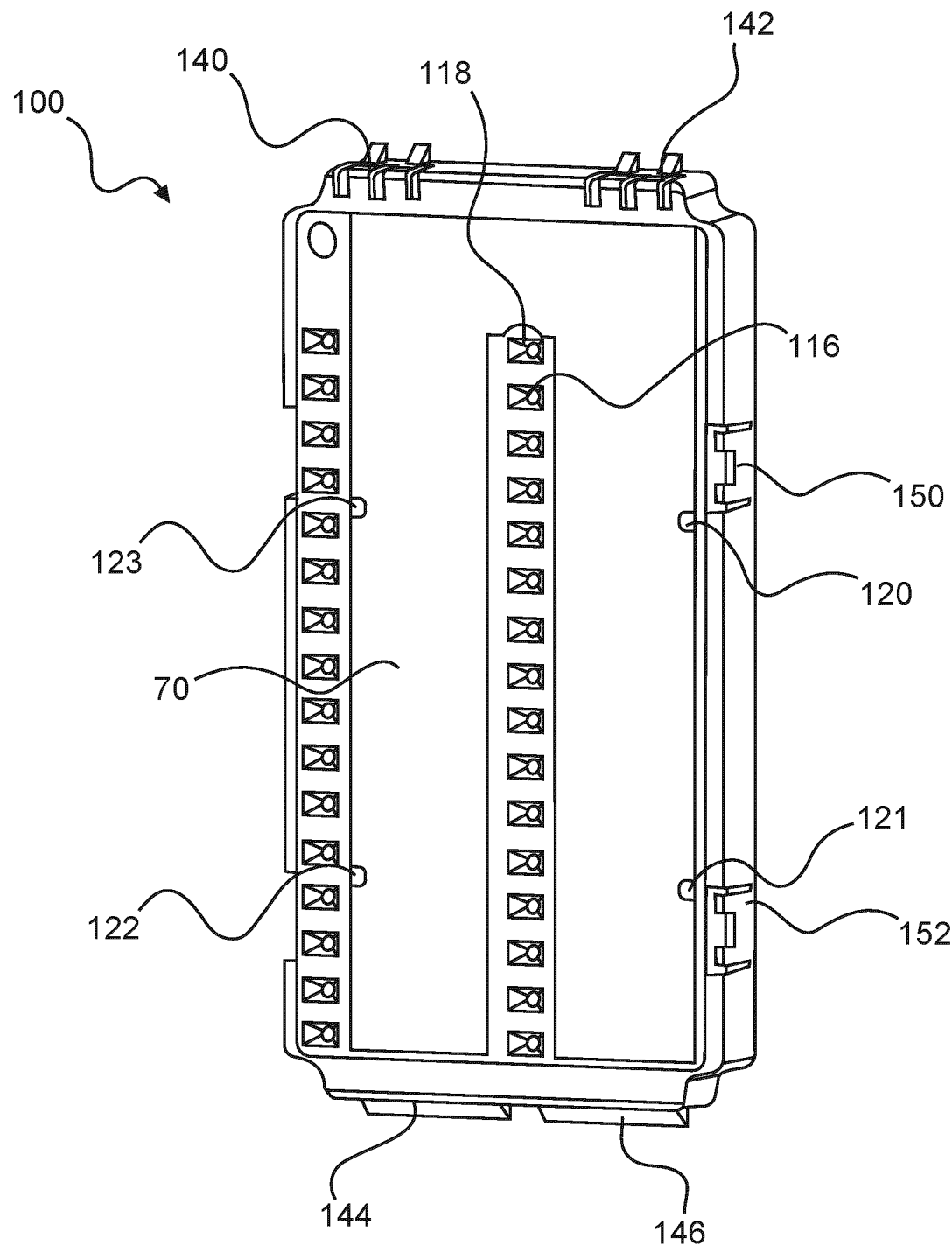
FIG. 10 shows a schematic, three-dimensional view of a front side of a support component.

FIG. 10 shows the arrangement of a labeling element 70 on the first support component 100 and the fastening to said first support component by means of the guide means 120-123.

Figure 11:
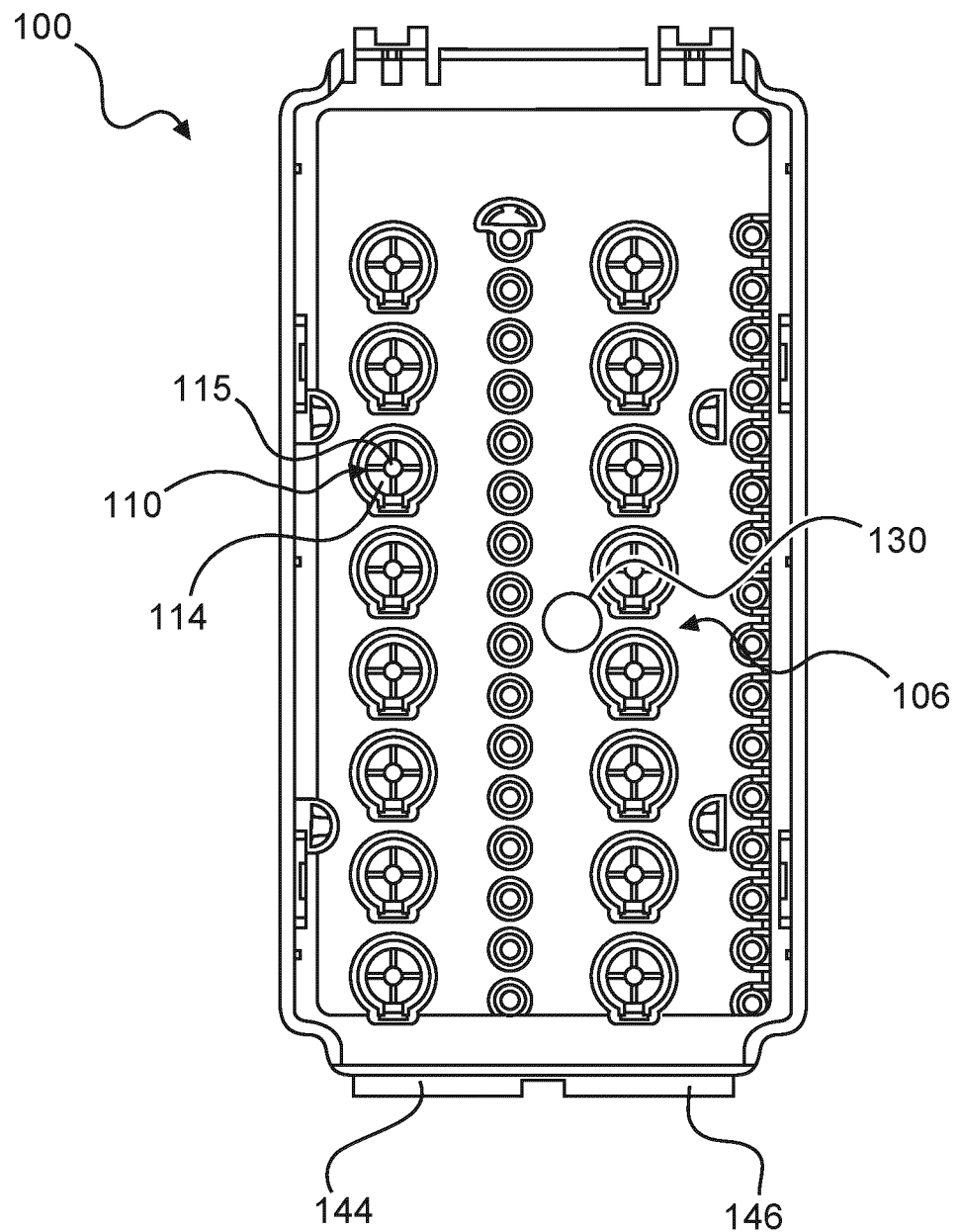
FIG. 11 shows a schematic, three-dimensional view of a rear side of the support component.

FIG. 11 shows the rear side of the first support component 100. The rear side of the operating element 110 is further shown, wherein it can be seen that a lug-like pressure element 115 is arranged on the rear side of the pressure section 114.

Figure 12:
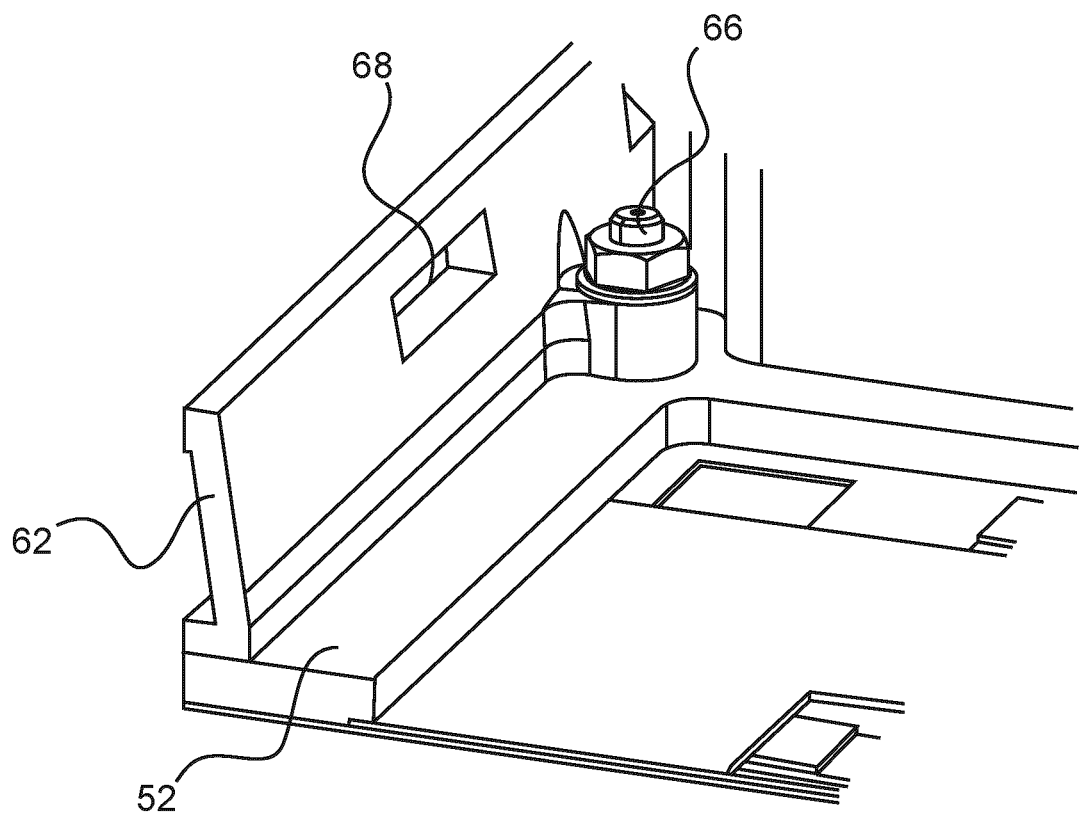
FIG. 12 shows a schematic, three-dimensional partial view of an indicator and operator control panel arrangement.

FIG. 12 further shows that a fastening opening 68 is arranged in the first holding frame section 62. The fastening opening 68 is of rectangular design, and therefore a cable tie can be arranged here. The fastening of the first holding frame section 62 to the indicator and operator control panel 52 is further shown in more detail. In this exemplary embodiment, this fastening is implemented by means of a fastening element 66.

Figure 13:
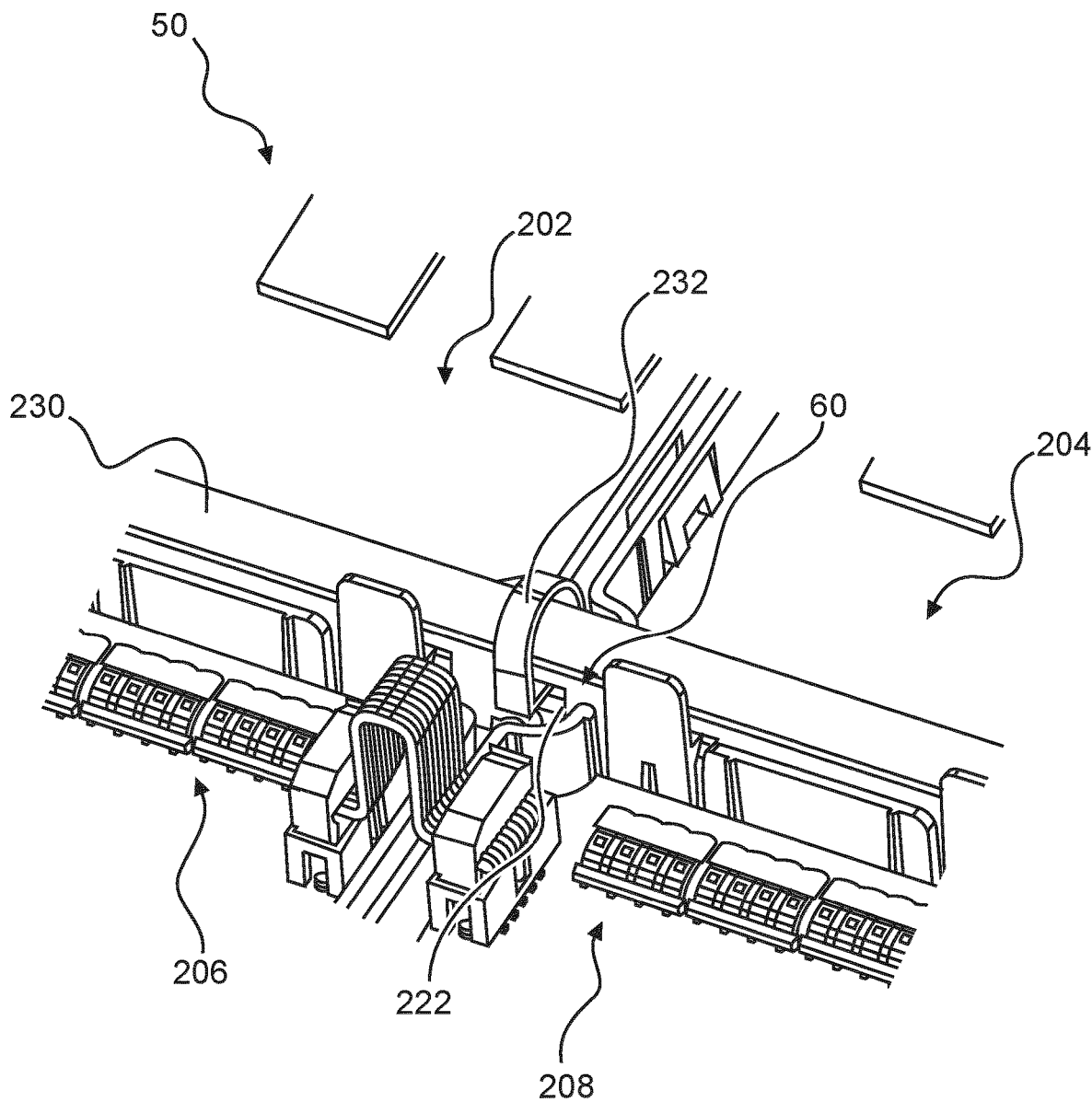
FIG. 13 shows a schematic, three-dimensional view of a further indicator and operator control panel arrangement.

FIG. 13 shows a schematic, three-dimensional view of a further indicator and operator control panel arrangement. The indicator and operator control panel arrangement 50 has a first operator control panel module 202, a second operator control panel module 204, a third operator control panel module 206 and a fourth operator control panel module 208. The indicator and operator control panel arrangement 50 can also have further operator control panel modules, for example a fifth operator control panel module and a sixth operator control panel module. The operator control panel modules 202-208 are latched to a holding frame 60. The holding frame 60 has a fastening opening 222. The fastening opening 222 is arranged in such a way that access is possible after fastening of the operator control panel modules 202-208. A cable bundle 230 can be arranged on the holding frame 60 by means of a fastening means 232, for example a cable tie, via the fastening opening 222.

LIST OF UTILIZED REFERENCE SIGNS

1 Hazard detection center
2 Display screen
4 First pushbutton region
6 Second pushbutton region
20 First operator control panel module
22 First printed circuit board
30 Second operator control panel module
32 Second printed circuit board
34 Second support component
50 Indicator and operator control panel arrangement
52 Indicator and operator control panel
54 First operating openings
56 Second operating openings
60 Holding frame
62 First holding frame section
64 Second holding frame section
66 Fastening element
68 Fastening opening
70 Labeling element
100 First support component 102 Base plate
104 Front side
106 Rear side
108 Operating region
109 Indicator region
110 Operating element
112 Neck section
114 Pressure section
115 Pressure element
116 First light passage
118 Second light passage
120 First guide means
121 Second guide means
122 Third guide means
123 Fourth guide means
124 Stop
130 First fixing
131, 132, 133, 134, 135 Second fixing
140, 142, 144, 146 First latching means
141 Upper support side
145 Lower support side
150, 152, 154, 156 Second latching means
151 Left-hand side
153 Right-hand side
158 Collar
202 First operator control panel module
204 Second operator control panel module
206 Third operator control panel module
208 Fourth operator control panel module
222 Fastening opening
230 Cable bundle
232 Fastening means

The invention claimed is:

1. An indicator and operator control panel arrangement of a hazard detection center, comprising: at least one operator control panel module including a support component and a printed circuit board; wherein the support component comprises: first latching means for latching-in connection of the support component to a holding frame arranged on an inner side of a wall of a housing, wherein the first latching means are arranged in such a way that a front side of the support component faces the inner side of the wall of the housing in a latched-in state, second latching means for latching-in connection to the printed circuit board, wherein the printed circuit board is arranged on a rear side, situated opposite the front side, of the support component in the latched-in state, an operating region which has at least one operating element which is designed to be deformed out of a starting position in a direction of the rear side by an action of force in order to transmit an operating force to the printed circuit board, wherein the operating element returns to the starting position when the action of force is withdrawn.

2. The support component as claimed in claim 1, further comprising:
an indicator region which has at least one light passage which is designed to guide an optical signal of the printed circuit board to the front side of the support component.

3. The support component as claimed in claim 1, further comprising:
guide means for guiding an exchangeable labeling element,
wherein the guide means are arranged on the front side of the support component in such a way that the labeling element is arranged between the support component and the housing wall in a latched-in state of the first latching means.

4. The support component as claimed in claim 1, wherein the support component is of one-piece design.

5. The support component as claimed in claim 4, wherein the support component consists of plastic and is produced using an injection molding process.

6. The support component as claimed in claim 3, wherein the guide means allow guidance of the labeling element in a same direction in which the latching-in connection is implemented by the first latching means.

7. The support component as claimed in claim 1, wherein the first latching means comprises a spring, formed on a lower side of the support component, and a latching finger, formed on an upper side of the support component, which has an outwardly directed latching lug, wherein the spring is designed as a resilient latching-in element.

8. The support component as claimed in claim 7, wherein a length of the latching finger is configured in such a way that the latching finger protrudes beyond a height of the holding frame in the latched-in state.

9. The support component as claimed in claim 7, wherein the latching finger of the first latching-in means is designed in such a way that the latching connection can be released using one hand and without tools.

10. The support component as claimed in claim 9, wherein the latching-in connection of the first latching means is made by pivoting about an axis which is defined by the spring.

11. The support component as claimed in claim 1, wherein the second latching means have latching lugs arranged opposite and formed on inner side faces of the support component.

12. The support component as claimed in claim 1, wherein a fixing element for horizontally fixing the printed circuit board latched into the second latching means on at least one inner side face, wherein the fixing element is designed to allow the horizontal fixing by plastic deformation during the latching-in connection of the printed circuit board.

13. The support component as claimed in claim 1, wherein
the operating region has a plurality of operating elements arranged in two columns, and
wherein one, two or several or each of the operating elements has/have at least one associated light passage.

14. The support component as claimed in claim 13, wherein one, two or several or each of the operating elements has two associated light passages.

15. The support component as claimed in claim 1, wherein
the operating element has a neck section and a pressure section, adjoining said neck section, with a larger cross section,
wherein the neck section is elastically deformed when pressure is exerted onto the pressure section.

16. The support component as claimed in claim 15, wherein the pressure section has a convexly curved shape in the direction of the front side.

17. The support component as claimed in claim 1, further comprising:
guide means having a plurality of guide lugs arranged substantially parallel to the front side of the support component,
wherein at least one of the guide lugs defines a stop counter to a guide direction, and
a bottom side of at least one guide lug is at a smaller distance from the rear side than the front side is from the rear side in a horizontal direction.

18. The support component as claimed in claim 1, further having a cutout for a display arranged on the printed circuit board.

19. The indicator and operator control panel arrangement of a hazard detection center as claimed in claim 1, comprising: an indicator and operator control panel and the holding frame.

20. The indicator and operator control panel arrangement as claimed in claim 19, wherein the holding frame is reversibly fastened on an inner side of the indicator and operator control panel, and/or the holding frame has a fastening opening for arranging fastening means for a cable bundle.

21. The indicator and operator control panel arrangement as claimed in claim 19, wherein the indicator and operator control panel has a film, wherein the film is arranged on a front side or a rear side of the indicator and operator control panel, wherein a section of a labeling element having an upper edge is arranged between the film and the indicator and operator control panel.

22. A housing of a hazard detection center, comprising:

a housing section having at least one indicator and operator control panel arrangement as claimed in claim 19.

23. A hazard detection center having the housing as claimed in claim 22, wherein the printed circuit boards of support components arranged next to one another are directly connected to a connecting cable for data transmission.

24. The hazard detection center as claimed in claim 23, wherein each of the printed circuit boards is designed to indicate the state of a plurality of peripheral devices connected in a signal-conducting manner to the hazard detection center, including a plurality of detector groups of a fire detection and/or extinguishing control station.

25. The hazard detection center as claimed in claim 24, wherein a designation of the detector groups is implemented by a labeling element of each of the respective support components.

* * * * *